United States Patent
Zheng et al.

(10) Patent No.: US 6,881,976 B1
(45) Date of Patent: Apr. 19, 2005

(54) HETEROJUNCTION BICMOS SEMICONDUCTOR

(75) Inventors: Jia Zhen Zheng, Singapore (SG); Lap Chan, Singapore (SG); Shao-fu Sanford Chu, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/705,163

(22) Filed: Nov. 6, 2003

(51) Int. Cl.[7] ..................... H01L 27/108; H01L 29/04; H01L 29/76; H01L 31/036; H01L 31/112

(52) U.S. Cl. ............... 257/69; 438/235; 438/191; 438/202; 438/195; 438/216; 438/189; 257/192; 257/197; 257/200; 257/201; 257/370; 257/565; 257/566; 257/204

(58) Field of Search ................ 438/235, 189, 438/191, 202, 195, 313, 322, FOR 165, FOR 168, FOR 187, 216; 257/E29.033, 192, 197, 200, 201, 370, 565, 566, 69, 204

(56) References Cited

U.S. PATENT DOCUMENTS 6,209,122 B1 * 3/2001 Jyu et al. .................... 716/6
2003/0197216 A1 * 10/2003 Kudo ........................ 257/312

* cited by examiner

*Primary Examiner*—David E. Graybill
(74) *Attorney, Agent, or Firm*—Mikio Ishimaru

(57) ABSTRACT

A BiCMOS semiconductor, and manufacturing method therefore, is provided. A semiconductor substrate having a collector region is provided. A pseudo-gate is formed over the collector region. An emitter window is formed in the pseudo-gate to form an extrinsic base structure. An undercut region beneath a portion of the pseudo-gate is formed to provide an intrinsic base structure in the undercut region. An emitter structure is formed in the emitter window over the intrinsic base structure. An interlevel dielectric layer is formed over the semiconductor substrate, and connections are formed through the interlevel dielectric layer to the collector region, the extrinsic base structure, and the emitter structure. The intrinsic base structure comprises a compound semiconductive material such as silicon and silicon-germanium, or silicon-germanium-carbon, or combinations thereof.

20 Claims, 3 Drawing Sheets

HETEROJUNCTION BICMOS SEMICONDUCTOR

TECHNICAL FIELD

The present invention relates generally to semiconductors having heterojunction bipolar transistors, and more particularly to the integration of CMOS transistors into such devices to form a BiCMOS semiconductor.

BACKGROUND ART

Transistors are multi-electrode semiconductor devices in which the current flowing between two specified electrodes is controlled or modulated by the voltage applied at a third (control) electrode. Transistors fall into two major classes: field-effect transistors (FETs), and bipolar junction transistors (BJTs).

FETs include a source, a drain, and a gate. A voltage applied to the gate results in a current flow between the source and the drain of the FET through a channel that is formed beneath the gate. A commonly used FET is a complimentary metal oxide semiconductor transistor, or CMOS transistor. CMOS transistors can be either NMOS or PMOS transistors depending upon the type of semiconductive materials used to form the transistor. CMOS semiconductors include both NMOS and PMOS transistors in one semiconductor.

BJTs comprise two p-n junctions placed back-to-back in close proximity to each other, with one of the regions common to both junctions. This forms either a p-n-p or an n-p-n transistor depending upon the characteristics of the semiconductive materials used. A BJT is a three-terminal device that can controllably vary the magnitude of the current that flows between two of the terminals. The three terminals include a base terminal, a collector terminal, and an emitter terminal. The movement of electrical charge carriers that produce electrical current flow between the collector and the emitter terminals vary dependent upon variations in the voltage on the base terminal thereby causing the magnitude of the current to vary. Thus, the current flow through the emitter and collector electrodes is controlled by the voltage across the base-emitter junction.

Recently, demand for BJTs has increased significantly because these transistors are capable of operating at higher speeds and driving more current. These characteristics are important for high-speed, high frequency communication networks such as those required by cell phones and computers.

BJTs can be used to provide linear voltage and current amplification because small variations of the base-emitter voltage and hence the base current at the input terminal result in large variations of the output collector current. The transistor can also be used as a switch in digital logic and power switching applications, switching from an "off" state to an "on" state. Such BJTs find application in analog and digital circuits and integrated circuits, at all frequencies from audio to radio frequency.

BiCMOS semiconductors include BJTs and CMOS transistors manufactured in the same semiconductor.

HBTs are BJTs where the emitter-base junction is a heterojunction between semiconductor materials of different, but similarly functioning types. HBTs using compound semiconductive materials have one advantage of being manufactured using common techniques used to manufacture silicon semiconductors. Silicon/Silicon Germanium (Si/SiGe) and Silicon/Silicon Germanium Carbon (Si/SiGeC) are two types of HBTs using compound semiconductive materials which have gained popularity due to their high speed and low electrical noise capabilities coupled with the ability to manufacture them using processing capabilities used in the manufacture of silicon BJTs. HBTs have found use in higher frequency applications such as cell phones, optical fiber and other high frequency applications requiring faster switching transistors, such as satellite communication devices.

Although the compound semiconductive layer has proven useful in HBTs, once formed by existing methods, this layer is subsequently subjected to multiple thermal cycles, implantations and/or etching processes during the formation steps of the remaining elements of the HBT such as the deposition and etching of oxide layers, nitride layers and the emitter. Several of these processing steps inherently damage the compound semiconductive layer. Etching polysilicon, for example, adversely affects the compound semiconductive layer beneath the polysilicon because the ethchants used do not selectively etch only the polysilicon. Some of the compound semiconductive layer is also etched during this processing step resulting in HBTs that are relatively slower and exhibit relatively poor noise performance.

Furthermore, to improve the operating speed of a HBT, it is important that the base layer be thin enough to minimize the time it takes electronic charges to move from the emitter to the collector, thereby minimizing the response time of the transistor, and have a high concentration of dopant in order to minimize base resistance. Typically, ion implantation techniques are widely used to form a base layer. However, this technique has the problem of ion channeling, which limits the minimum thickness of the base layer. Another disadvantage of ion implantation is that the Si/SiGe or Si/SiGeC layer is often damaged by the ions during implantation. Additionally, high temperature annealing is required to drive the dopant into the material layers. This annealing step, however, alters the concentration profile within the various layers of semiconductive materials making up the transistor.

Furthermore, the differences in manufacturing techniques used to form CMOS and HBTs have made it difficult to manufacture BiCMOS semiconductors using compound semiconductive materials that have proven to be beneficial in HBTs.

Solutions to these problems have been long sought but prior developments have not taught or suggested any solutions and, thus, solutions to these problems have long eluded those skilled in the art.

DISCLOSURE OF THE INVENTION

IS The present invention provides a BiCMOS semiconductor, and manufacturing method therefor. A semiconductor substrate having a collector region is provided. A pseudo-gate is formed over the collector region. An emitter window is formed in the pseudo-gate to form an extrinsic base structure. An undercut region beneath a portion of the pseudo-gate is formed to provide an intrinsic base structure in the undercut region. An emitter structure is formed in the emitter window over the intrinsic base structure. An interlevel dielectric layer is formed over the semiconductor substrate, and connections are formed through the interlevel dielectric layer to the collector region, the extrinsic base structure, and the emitter structure.

The intrinsic base structure preferably comprises a compound semiconductive material such as silicon and silicon-germanium, or silicon-germanium-carbon, or combinations thereof.

The present invention provides a BiCMOS semiconductor comprising a heterojunction bipolar transistor (HBT) having low base resistance and high performance.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent to one skilled in the art that the invention may be practiced without these specific details. In order to avoid obscuring the present invention, some well-known configurations and process steps are not disclosed in detail.

Likewise, the drawings showing embodiments of the apparatus are semi-diagrammatic and not to scale and, particularly, some of the dimensions are for the clarity of presentation and are shown greatly exaggerated in the FIGS. Generally, the device can be operated in any orientation.

The term "horizontal" as used herein is defined as a plane parallel to the conventional plane or surface of a semiconductor wafer or substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

The term "processing" or "processed" as used herein includes deposition of material or photoresist, patterning, exposure, development, etching, cleaning, and/or removal of the material or photoresist as required in forming a described structure.

Figure 1:
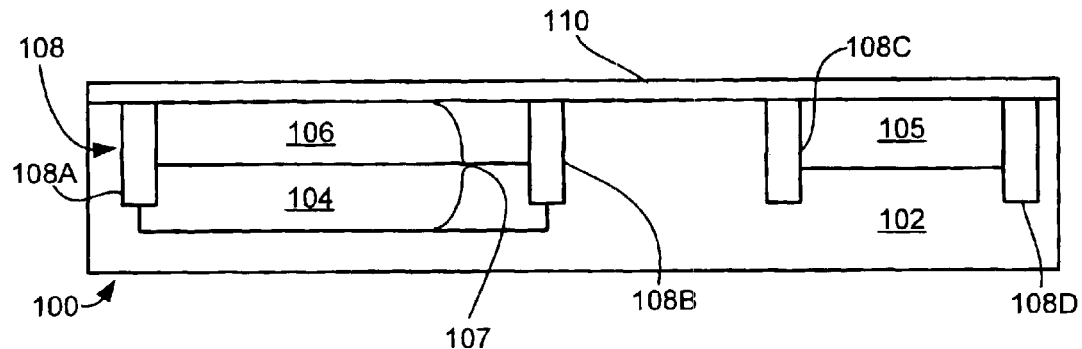
FIG. 1 is a partial cross-sectional view of a BiCMOS semiconductor in an intermediate stage of manufacture in accordance with the present invention.

Referring now to FIG. 1, therein is shown a partial cross-sectional view of a semiconductor 100 in an intermediate stage of manufacture in accordance with the present invention. The semiconductor 100 includes a semiconductor substrate 102, such as a lightly doped semiconductor substrate of a first conductivity type, for example a p⁻ doped semiconductor substrate. The semiconductor substrate 102 has a buried collector region 104, such as a heavily doped region of a second conductivity type, for example an n⁺doped region and a sub-collector region 106 above the buried collector region 104, such as a lightly doped region of the second conductivity type, for example an n⁻ doped region. Together the buried collector region 104 and the sub-collector region 106 will be referred to as a collector region 107.

The semiconductor substrate 102 also has an n-channel region 105 in the area of the PMOS transistors, such as a lightly doped region of the second conductivity type, for example an n- doped region. The sub-collector region 106 and the n-channel region 105 may be formed at the same time using a conventional ion implantation process.

The semiconductor substrate 102 also has a plurality of shallow trench isolations (STIs) 108 to isolate the transistors to be manufactured on the semiconductor substrate 102. The plurality of STIs 108 is provided by forming trenches in the semiconductor substrate 102. The trenches are then filled with an insulating material to form the plurality of (STIs) 108. The surface may then be processed using a chemical mechanical polish (CMP) process which stops on the surface of the semiconductor substrate 102 so that the upper surface's of the plurality of STIs 108 are coplanar with the upper surface of the semiconductor substrate 102. The plurality of STIs 108 are individually referred to herein as a first STI 108A, a second STI 108B, a third STI 108C, and a fourth STI 108D. A first insulating layer 110, such as an oxide layer, is then formed over the surface of the semiconductor substrate 102.

For purposes of this disclosure and without intending to limit the scope of the present invention, the location between the STI 108A and the STI 108B will be referred to as the HBT region, the location between the STI 108B and the STI 108C will be referred to as the NMOS region, and the location between the STI 108C and the STI 108D will be referred to as the PMOS region in the FIGS.

Figure 2:
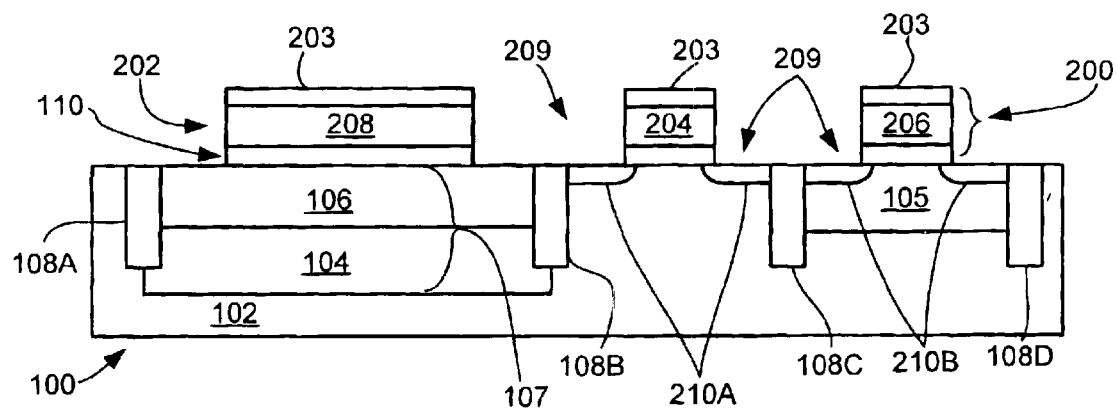
FIG. 2 is the structure of FIG. 1 after formation of the semiconductive gates of the CMOS transistors.

Referring now to FIG. 2, therein is shown the structure of FIG. 1 after formation of a plurality of gate structures 200 in the semiconductor 100. The plurality of gate structures 200 is provided by forming a polysilicon layer 202 over the first insulating layer 110. A second insulating layer 203, such as a nitride layer, is then formed over the polysilicon layer 202. A photoresist layer is deposited on the second insulating layer 203, patterned, and processed to form a gate mask. The gate mask is processed to form the plurality of gate structures 200 by etching the second insulating layer 203 and the polysilicon layer 202.

The plurality of gate structures 200 comprises an NMOS gate 264, a PMOS gate 206, and a pseudo-gate 208, such as a pseudo-PMOS gate. The PMOS gate 206 and the pseudo-gate 208 comprise a layer of heavily doped semiconductive material of the first conductivity type, such as a p⁺ doped polysilicon layer. The NMOS gate 204 comprises a layer of heavily doped semiconductive material of the second conductivity type, such as an n⁺doped polysilicon layer.

Although it will be apparent to those skilled in the art that the placement of transistors on the substrate is a matter of design, for ease of disclosure the transistor to be located between the STI 108A and the STI 108B will be referred to as the HBT, the transistor to be located between the STI 108B and the STI 108C will be referred to herein as the NMOS transistor, and the transistor to be located between the STI 108C and the STI 108D will be referred to herein as the PMOS transistor. After formation of the plurality of gate structures 200, the first insulating layer is patterned and etched to expose a plurality of source/drain windows 209 adjacent the NMOS gate 204 and the PMOS gate 206. The plurality of source/drain windows 209 are then implanted with an appropriate dopant to form a first plurality of lightly doped drain (LDD) regions 210A in the semiconductor substrate 102 adjacent the NMOS gate 204 and a second plurality of LDD regions 210B in the semiconductor substrate 102 adjacent the PMOS gate 206, respectively. For example, the first plurality of source/drain regions 210A adjacent the NMOS gate 204 are lightly doped to form a first plurality of LDD regions having a second conductivity type, such as by implanting an n⁻ dopant. The second plurality of source/drain regions 210B adjacent the PMOS gate 206 are lightly doped to form a second plurality of LDD regions having a first conductivity type, such as by implanting a p⁻ dopant.

Figure 3:
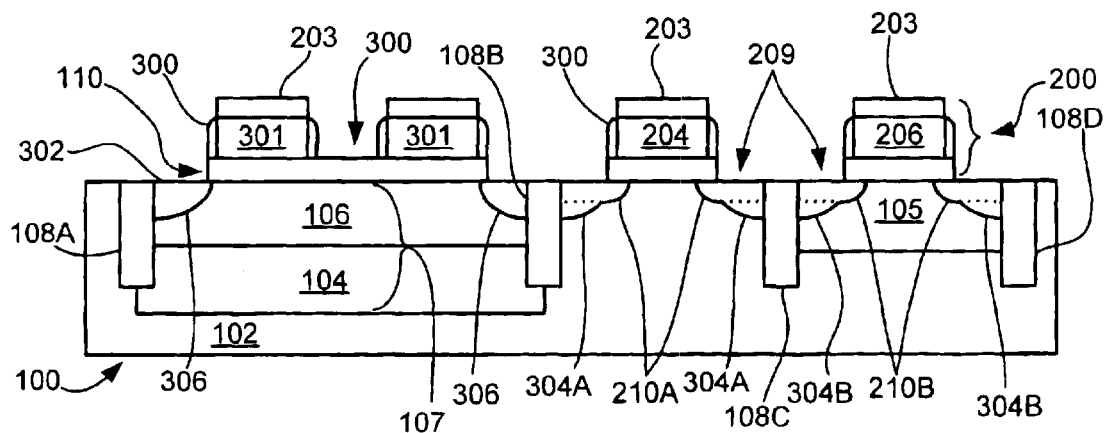
FIG. 3 is the structure of FIG. 2 after implantation of a plurality of source/drain regions in the CMOS transistors.

Referring now to FIG. 3, therein is shown the structure of FIG. 2 after implantation of a first plurality of source/drains 304A adjacent the NMOS gate 204 and a second plurality of source/drains 304B adjacent the PMOS gate 206. The first plurality of source/drains 304A is formed by heavily implanting a material such as an n⁺dopant, to form a first plurality of source/drains 304B of the second conductivity type. The second plurality of source/drains 304B is formed by heavily implanting a material, such as a p⁺ dopant to form a second plurality of source/drains of the first conductivity type.

The pseudo-gate 208 shown in FIG. 2 is processed using conventional photolithographic techniques to form an emitter window 300 in the pseudo-gate 208 and an extrinsic base structure 301. The NMOS gate 204, the PMOS gate 206 and the extrinsic base structure 301 then each have a first insulating spacer 302 formed around their respective outer edges. The first insulating spacer 302 is formed by deposing a layer of insulating material, such as an oxide or nitride layer, and then processing the insulating layer to form the first insulating spacer 302.

After formation of the first insulating spacer 302, the portion of the first insulating layer 110 adjacent the outer edge of the extrinsic base structure 301 is patterned and etched to expose a portion 303 of the sub-collector region 106. The exposed portion 303 of the sub-collector region 106 can receive the same implant that was used to form the first plurality of source/drains 304A in the NMOS region of the semiconductor substrate 102 to form a plurality of pocket implant regions 306. Formation of the plurality of pocket implant regions 306 can occur at the same time as the formation of the first plurality of source/drain regions 304A in the NMOS region.

Figure 4:
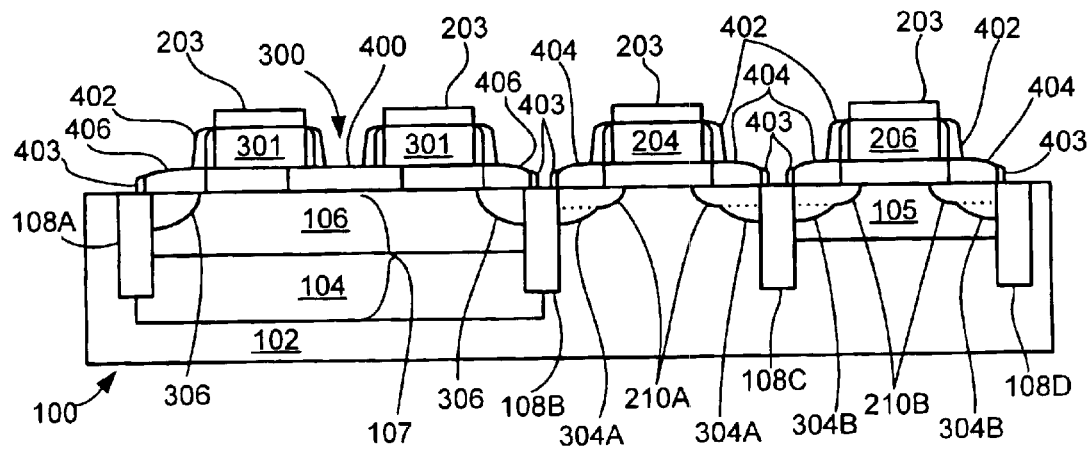
FIG. 4 is the structure of FIG. 3 after formation of an intrinsic base structure in the HBT.

Referring now to FIG. 4, therein is shown the structure of FIG. 3 after formation of an intrinsic base structure 400. The portion of the first insulating layer 110 intermediate the inner edges of the extrinsic base structure 301 is etched to expose the portion of the sub-collector region 106 under the emitter window 300. Preferably, an isotropic etch, such as a wet etch process, is used to allow the etchant to undercut a portion of the first insulating layer beneath the inner edges of the extrinsic base structure 301.

The intrinsic base structure 400 is formed by providing a compound semiconductive material of the first conductivity type in the emitter window 300 to form the intrinsic base structure 400 in the bottom of the emitter window 300. Preferably, the intrinsic base structure 400 is formed by selective deposition of epitaxial silicon and silicon-germanium, a silicon-germanium-carbon compound, a compound semiconductive material of the first conductivity type, or combinations thereof in the emitter window 300. The intrinsic base structure 400 also fills the portion under the extrinsic base structure 301 that was undercut during the etching process.

During formation of the intrinsic base structure 400, a plurality of raised source/drains 404 is formed in the NMOS and PMOS transistors by forming the compound semiconductive layer over the source/drain regions adjacent the NMOS gate 204 and the PMOS gate 206. A plurality of raised contact areas 406 is also formed over the sub-collector region 106 adjacent the outer edge of the extrinsic base structure 301.

A second insulating spacer 402, such as an oxide or oxide/nitride spacer, is then formed around each of the first insulating spacers 302 of FIG. 3 and in the emitter window 300. A plurality of third insulating spacers 403 also is formed around each of the plurality of raised source/drains 404 of the NMOS and PMOS transistors and the raised contact areas 406 of the bipolar transistor.

Figure 5:
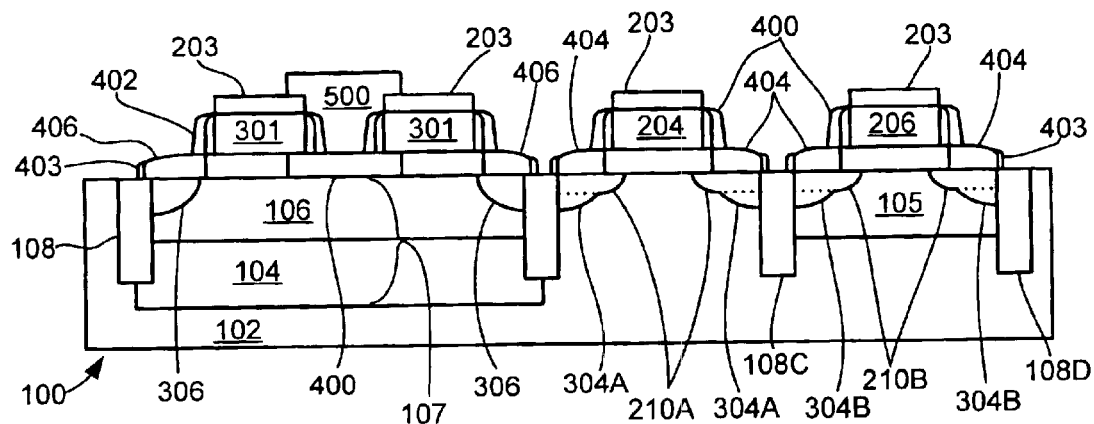
FIG. 5 is the structure of FIG. 4 after formation of an emitter structure in the HBT.

Referring now to FIG. 5, therein is shown the structure of FIG. 4 after formation of an emitter structure 500 in the emitter window 300 shown in FIGS. 3 and 4 over the intrinsic base structure 400. The emitter structure 500 is formed in the emitter window 306 by depositing a heavily doped polysilicon layer of the second conductivity type, such as an n⁺doped polysilicon layer, and processing the polysilicon layer to form the emitter structure 500.

Figure 6:
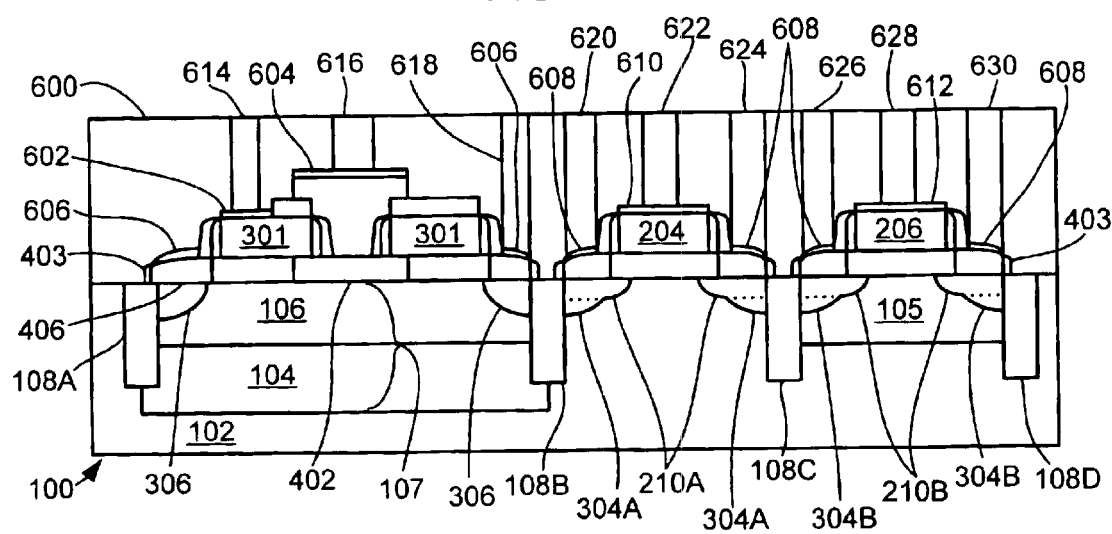
FIG. 6 is the structure of FIG. 5 after formation of a plurality of contacts in an interlevel dielectric layer.

Referring now to FIG. 6, therein is shown the structure of FIG. 5 after formation: of a plurality of contacts in an interlevel dielectric layer (ILD) 600. The structures of the transistors that will serve as locations for the contacts have a salicide formed over them; in a conventional manner.

Accordingly, the extrinsic base structure 301 has a first salicide layer 602 formed over the top of the extrinsic base structure 301. The emitter structure 500 has a second salicide layer 604 formed over the emitter structure 500. The plurality of raised contact areas 406 have a third salicide layer 606 formed over them. The plurality of raised source/drains 404 have a fourth salicide layer 608 formed over them. The NMOS gate 204 has a fifth salicide layer 610 formed over the NMOS gate 204, and the PMOS gate 206 has a sixth salicide layer 612 formed over the PMOS gate 206.

The ILD layer 600 is formed over the structure and processed using a CMP process to planarize the ILD layer 600. The ILD layer 600 has holes formed through the ILD layer 600 over the various contact areas. The holes in the ILD layer 600 are filled with a suitable conductive material, such as tungsten, to form the various contacts.

Thus, a base contact 614 is formed through the ILD layer 600 in contact with the first salicide layer 602 over the extrinsic base structure 301. An emitter contact 616' is formed through the ILD layer 600 in contact with the second salicide layer 604 over the emitter structure 500. A collector contact 618 is formed over the third salicide layer 606 on top of the plurality of raised contact areas 406 overlying the sub-collector region 106.

A source contact 620 is formed through the ILD layer 600 in contact with the fourth salicide layer 608 over the plurality of raised source/drains 404 of the NMOS transistor. An NMOS gate contact 622 is formed through the ILD layer 600 in contact with the fifth salicide layer 610 over the NMOS gate 204. An NMOS drain contact 624 is formed through the ILD layer 600 in contact with the fourth salicide layer 608 over the plurality of raised source/drains 404 of the NMOS transistor.

A source contact 626 is formed through the ILD layer 600 in contact with the fourth salicide layer 608 over the plurality of raised source/drains 404 of the PMOS transistor. A PMOS gate contact 628 is formed through the ILD layer 600 in contact with the sixth salicide layer 612 over the PMOS gate 206 of the PMOS transistor. A PMOS drain contact 630 is formed through the ILD layer 600 in contact with the fourth salicide layer 608 over the plurality of raised source/drains 404 of the PMOS transistor. Thus, the semiconductor contacts are formed for the HBT and the CMOS transistors in the semiconductor 100.

Figure 7:
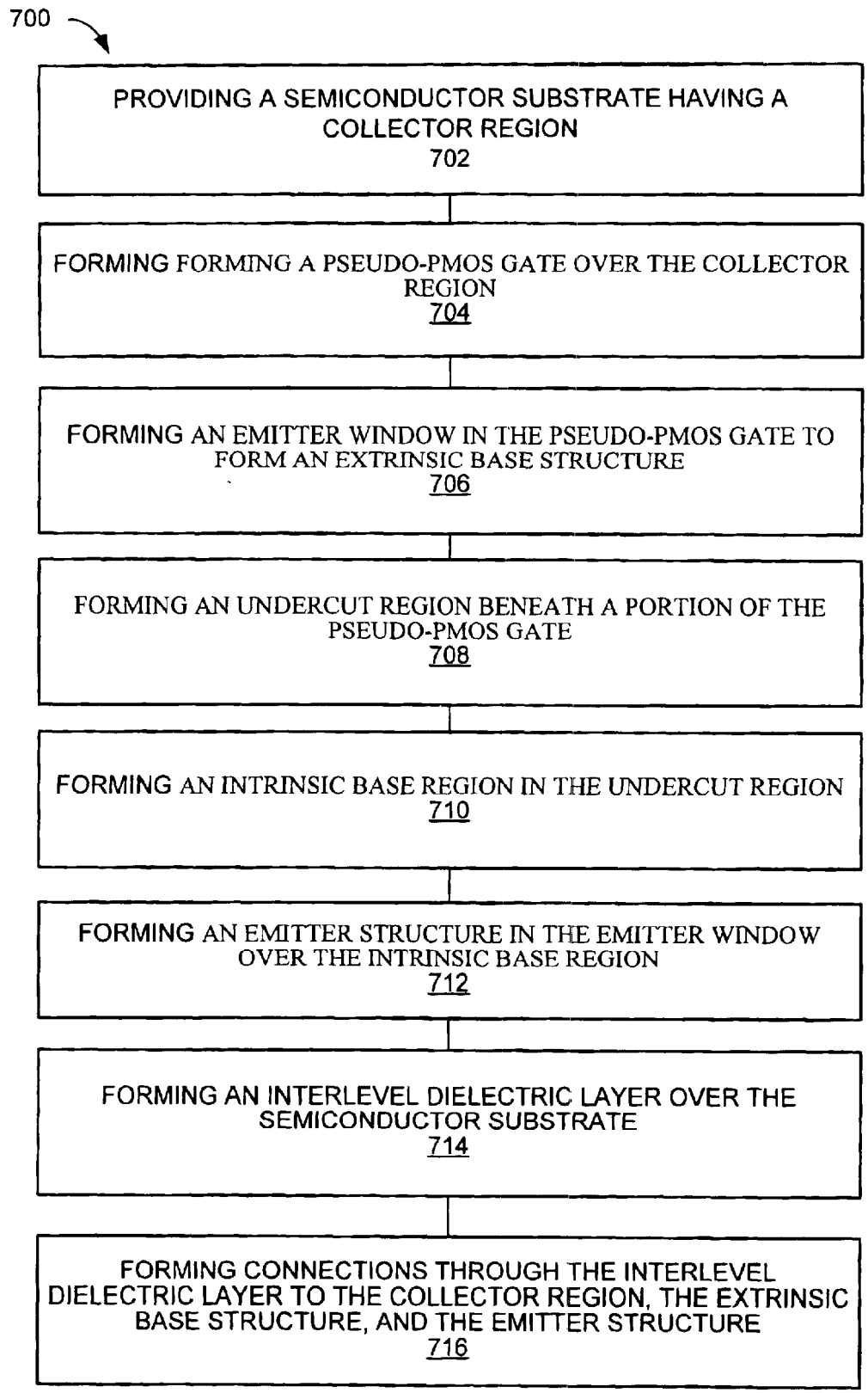
FIG. 7 is a flow chart of a method for manufacturing a heterojunction BiCMOS semiconductor in accordance with the present invention.

Referring now to FIG. 7, therein is shown a flow chart of a method 700 for providing a BiCMOS semiconductor in accordance with the present invention. The method 700 includes a step 702 of providing a semiconductor substrate having a collector region; a step 704 of forming a pseudo-gate over the collector region; a step 706 of forming an emitter window in the pseudo-gate to form an extrinsic base structure; a step 708 of forming an undercut region beneath a portion of the pseudo-gate; a step 710 of forming an intrinsic base structure in the undercut region; a step 712 of forming an emitter structure in the emitter window over the intrinsic base structure; a step 714 of forming an interlevel dielectric layer over the semiconductor substrate; and a step 716 of forming connections through the interlevel dielectric layer to the collector region, the extrinsic base structure, and the emitter structure.

Thus, it has been discovered that the method and apparatus of the present invention furnish important and heretofore unavailable solutions, capabilities, and functional advantages for BiCMOS semiconductors having heterojunction bipolar transistors. The resulting process and configurations are straightforward, economical, uncomplicated, highly versatile and effective, use conventional technologies, and are thus readily suited for manufacturing BiCMOS semiconductor devices/fully compatible with conventional manufacturing processes and technologies.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the spirit and scope of the included claims. All matters hitherto-fore set forth herein or shown in the accompanying drawings are to be interpreted in an illustrative and non-limiting sense.

The invention claimed is:

1. A method of manufacturing a BiCMOS semiconductor comprising:
   providing a semiconductor substrate having a collector region;
   forming a pseudo-gate over the collector region;
   forming an emitter window in the pseudo-gate to form an extrinsic base structure;
   forming an undercut region beneath a portion of the extrinsic base structure;
   forming an intrinsic base structure in the undercut region;
   forming an emitter structure in the emitter window over the intrinsic base structure;
   forming an interlevel dielectric layer over the semiconductor substrate; and
   forming connections through the interlevel dielectric layer to the collector region, the extrinsic base structure, and the emitter structure.

2. The method of manufacturing a BiCMOS semiconductor as claimed in claim 1 wherein forming the intrinsic base structure comprises forming a region comprising silicon and silicon-germanium, or silicon-germanium-carbon, or combinations thereof.

3. The method of manufacturing a BiCMOS semiconductor as claimed in claim 1 wherein forming the intrinsic base structure forms a region comprising a compound semiconductive material.

4. The method of manufacturing a BiCMOS semiconductor as claimed in claim 1 wherein forming the pseudo-gate comprises forming a pseudo-gate of the same conductivity type as the conductivity type of the substrate.

5. The method of manufacturing a BiCMOS semiconductor as claimed in claim 1 wherein forming the pseudo-gate forms a pseudo-PMOS gate.

6. A method of manufacturing a BiCMOS semiconductor comprising:
   providing a semiconductor substrate of a first conductivity type having a collector region of a second conductivity type;
   forming a plurality of gate structures;
   forming an emitter window in at least one of the plurality of gate structures of the first conductivity type over the collector region to form an extrinsic base structure;
   forming an intrinsic base structure of the first conductivity type at least partially under the at least one of the plurality of gate structures;
   forming an emitter structure of the second conductivity type in the emitter window over the intrinsic base structure;
   forming an interlevel dielectric layer over the semiconductor substrate; and
   forming connections through the interlevel dielectric layer to the collector region, the extrinsic base structure, and the emitter structure.

7. The method of manufacturing a BiCMOS semiconductor as claimed in claim 6 wherein forming the intrinsic base structure forms a region comprising a compound semiconductive material.

8. The method of manufacturing a BiCMOS semiconductor as claimed in claim 6 wherein forming the intrinsic base structure forms a region comprising silicon and silicon-germanium, or silicon-germanium-carbon, or combinations thereof.

9. The method of manufacturing a BiCMOS semiconductor as claimed in claim 6 wherein forming the plurality of gate structures forms a second plurality of gate structures of the first conductivity type and a third plurality of gate structures of the second conductivity type.

10. The method of manufacturing a BiCMOS semiconductor as claimed in claim 6 wherein forming the emitter window forms the emitter window in a pseudo-gate.

11. A BiCMOS semiconductor comprising:
    a semiconductor substrate having a collector region;
    a pseudo-gate over the collector region;
    an emitter window in the pseudo-gate to form an extrinsic base structure;
    the extrinsic base structure having an undercut region beneath a portion of the extrinsic base structure;
    an intrinsic base structure in the undercut region;
    an emitter structure in the emitter window over the intrinsic base structure an interlevel dielectric layer over the semiconductor substrate; and
    connections through the interlevel dielectric layer to the collector region, the extrinsic base structure, and the emitter structure.

12. A BiCMOS semiconductor as claimed in claim 11 wherein the intrinsic base structure comprises a compound semiconductive material.

13. A BiCMOS semiconductor as claimed in claim 11 wherein the intrinsic base structure comprises silicon and silicon-germanium, or silicon-germanium-carbon, or combinations thereof.

14. The method of manufacturing a BiCMOS semiconductor as claimed in claim 11 wherein forming the pseudo-gate comprises forming a pseudo-gate of the same conductivity type as the conductivity type of the substrate.

15. A BiCMOS semiconductor as claimed in claim 11 wherein the pseudo-gate comprises a pseudo-PMOS gate.

16. A BiCMOS semiconductor comprising:
   a semiconductor substrate of a first conductivity type having a collector region of a second conductivity type;
   a plurality of gate structures;
   an emitter window in at least one of the plurality of gate structures of the first conductivity type over the collector region to form an extrinsic base structure;
   an intrinsic base structure of the first conductivity type at least partially under the at least one of the plurality of gate structures;
   an emitter structure of the second conductivity type in the emitter window over the intrinsic base structure;
   an interlevel dielectric layer over the semiconductor substrate; and
   connections through the interlevel dielectric layer to the collector region, the extrinsic base structure, and the emitter structure.

17. A BiCMOS semiconductor as claimed in claim 16 wherein the intrinsic base structure comprises a compound semiconductive material.

18. A BiCMOS semiconductor as claimed in claim 16 wherein the intrinsic base structure comprises silicon and silicon-germanium, or silicon-germanium-carbon, or combinations thereof.

19. A BiCMOS semiconductor as claimed in claim 16 wherein the plurality of gate structures forms a second plurality of polysilicon gate structures of the first conductivity type and a third plurality of polysilicon gate structures of the second conductivity type.

20. A BiCMOS semiconductor as claimed in claim 16 wherein the emitter window is formed in a pseudo-gate.

* * * * *

UNITED STATES PATENT AND TRADEMARK OFFICE
CERTIFICATE OF CORRECTION

PATENT NO. : 6,881,976 B1
DATED : April 19, 2005
INVENTOR(S) : Zheng et al.

It is certified that error appears in the above-identified patent and that said Letters Patent is hereby corrected as shown below:

Column 2,
Line 51, delete "IS" at the beginning of the paragraph

Column 4,
Line 48, delete "264" and insert therefor -- 204 --
Line 63, insert a carriage return -- ¶ -- and begin a new paragraph after the sentence ending with the word "transistor."

Column 6,
Line 20, delete "306" and insert therefor -- 300 --

Column 8,
Line 60, delete "structure" and insert therfor -- structure; --followed by a carriage return -- ¶ --

Signed and Sealed this

Nineteenth Day of July, 2005

JON W. DUDAS
*Director of the United States Patent and Trademark Office*